(12) United States Patent
Ha et al.

(10) Patent No.: US 11,527,687 B2
(45) Date of Patent: Dec. 13, 2022

(54) DISPLAY MODULE AND METHOD FOR MOLDING DISPLAY MODULE

(71) Applicant: SAMSUNG ELECTRONICS CO., LTD., Suwon-si (KR)

(72) Inventors: Taehyeun Ha, Suwon-si (KR); Jaehoo Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 272 days.

(21) Appl. No.: 16/869,719

(22) Filed: May 8, 2020

(65) Prior Publication Data
US 2020/0357963 A1 Nov. 12, 2020

(30) Foreign Application Priority Data
May 8, 2019 (KR) .................. 10-2019-0053619

(51) Int. Cl.
| | | |
|---|---|---|
| H01L 33/54 | (2010.01) | |
| H01L 25/075 | (2006.01) | |
| B29C 45/14 | (2006.01) | |
| B29C 45/16 | (2006.01) | |
| B29L 31/34 | (2006.01) | |

(52) U.S. Cl.
CPC ........ H01L 33/54 (2013.01); B29C 45/14065 (2013.01); B29C 45/1671 (2013.01); H01L 25/0753 (2013.01); B29K 2995/0026 (2013.01); B29L 2031/3475 (2013.01); H01L 2933/005 (2013.01)

(58) Field of Classification Search
CPC .................................................. H01L 2933/00
See application file for complete search history.

(56) References Cited

U.S. PATENT DOCUMENTS

| | | |
|---|---|---|
| 9,299,948 B2 | 3/2016 | Lee et al. |
| 9,991,470 B2 | 6/2018 | Lee et al. |
| 10,080,296 B2 | 9/2018 | Kim et al. |
| 10,251,224 B2 | 4/2019 | Kim et al. |
| 10,290,607 B2 | 5/2019 | Tamaki et al. |
| 10,423,380 B2 | 9/2019 | Kim et al. |

(Continued)

FOREIGN PATENT DOCUMENTS

| | | |
|---|---|---|
| EP | 1 864 780 A2 | 12/2007 |
| EP | 2 869 288 A1 | 5/2015 |

(Continued)

OTHER PUBLICATIONS

Examination Report dated Mar. 7, 2022 issued by the European Patent Office for European Patent Application No. 20173256.7.

(Continued)

*Primary Examiner* — Mounir S Amer
(74) *Attorney, Agent, or Firm* — Sughrue Mion, PLLC

(57) ABSTRACT

A method for molding a display module includes forming a cavity using a die plate of a first die and a plurality of side surface dies; filling the cavity with a coating material; fixing the display module to a second die using a coupling body disposed on a second surface of the display module, opposite of a first surface of the display module disposed with a plurality of LEDs; soaking the display module in the coating material filled in the cavity; curing the coating material; and separating the cured coating material of the display module from the die plate.

15 Claims, 21 Drawing Sheets

(56) References Cited

U.S. PATENT DOCUMENTS

| | | | |
|---|---|---|---|
| 10,477,696 B2 | 11/2019 | Kim et al. | |
| 2014/0048779 A1 | 2/2014 | Lee et al. | |
| 2016/0141268 A1* | 5/2016 | Nakamura | H01L 24/97 |
| | | | 257/778 |
| 2016/0204382 A1 | 7/2016 | Lee et al. | |
| 2017/0080606 A1* | 3/2017 | Kim | H01L 27/156 |
| 2017/0136669 A1 | 5/2017 | Choi et al. | |
| 2018/0239193 A1 | 8/2018 | Hayashi | |
| 2018/0359863 A1 | 12/2018 | Lee et al. | |
| 2022/0078936 A1* | 3/2022 | Doi | B29C 45/1671 |
| 2022/0149246 A1* | 5/2022 | Park | H01L 33/58 |

FOREIGN PATENT DOCUMENTS

| | | |
|---|---|---|
| JP | 2016-212310 A | 12/2016 |
| JP | 2018-133304 A | 8/2018 |
| KR | 10-2009-0115340 A | 11/2009 |
| KR | 10-1122136 B1 | 3/2012 |
| KR | 10-2014-0022633 A | 2/2014 |
| KR | 10-2016-0038867 A | 4/2016 |
| KR | 10-2016-0059964 A | 5/2016 |
| KR | 10-2016-0139663 A | 12/2016 |
| KR | 10-2017-0035278 A | 3/2017 |
| KR | 10-2017-0055787 A | 5/2017 |
| KR | 10-2017-0140000 A | 12/2017 |
| KR | 10-1829190 B1 | 2/2018 |

OTHER PUBLICATIONS

Communication dated Sep. 14, 2020 issued by the European Intellectual Property Office in counterpart European Application No. 20173256.7.

International Search Report dated Aug. 18, 2020 issued by the International Searching Authority in counterpart International Application No. PCT/KR2020/005973 (PCT/ISA/210).

International Written Opinion dated Aug. 18, 2020 issued by the International Searching Authority in counterpart International Application No. PCT/KR2020/005973 (PCT/ISA/237).

* cited by examiner

DISPLAY MODULE AND METHOD FOR MOLDING DISPLAY MODULE

CROSS-REFERENCE TO THE RELATED APPLICATION

This application is based on and claims priority under 35 U.S.C. § 119 to Korean Patent Application No. 10-2019-0053619, filed on May 8, 2019, in the Korean Intellectual Property Office, the disclosure of which is incorporated by reference herein in its entirety.

BACKGROUND

1. Field

Embodiments of the disclosure relate to a display module with improved manufacturing efficiency and contrast ratio and a method for molding a display module.

2. Description of Related Art

LED displays constitute a display screen using a plurality of display modules disposed with a plurality of LEDs, and is widely used in indoor and outdoor large scale billboards and large scale electronic display board markets. Further, LED displays may be implemented as high quality large scale screens with superior brightness and color compared to previous LCD displays.

The LED displays are disadvantageous in that durability is decreased as a result of damage being generated by damage from the environment (e.g., moisture, ultraviolet rays, etc.) of being exposed outside or damage from static generated from a hand or body of a user in the process of installation Accordingly, a coating solution for waterproofing each of the plurality of LEDs disposed on the LED display has been conventionally applied through a dispensing or spraying method.

However, the conventional method has been problematic in that much coating time and coating solution is consumed when coating an entire surface of the LED display.

SUMMARY

According to one or more embodiments, a method for molding a display module, includes: forming a cavity using a die plate of a first die and a plurality of side surface dies; filling the cavity with a coating material; fixing the display module to a second die using a coupling body disposed on a second surface of the display module, opposite of a first surface of the display module disposed with a plurality of LEDs; soaking the display module in the coating material filled in the cavity; curing the coating material; and separating the cured coating material of the display module from the die plate.

According to an embodiment, the method further includes cooling the coating material after curing the coating material.

According to an embodiment, the forming the cavity includes moving the plurality of side surface dies to contact the die plate.

According to an embodiment, the filling the cavity with the coating material includes injecting the coating material such that a height of the coating material is greater than a height of the plurality of LEDs disposed on the first surface.

According to an embodiment, the separating the cured coating material from the die plate includes separating the plurality of side surface dies from the die plate.

According to an embodiment, each of the plurality of side surface dies includes: a contact body configured to contact with the die plate; an actuator including an axis coupled with the contact body, the actuator configured to move the contact body; and a guide body provided on the first die and configured to guide the contact body by slidably-coupling with the contact body, wherein the contact body is configured to slidably move along the guide body.

According to an embodiment, the soaking the display module in the coating material includes soaking the display module in a direction of the first surface such that a side surface of the plurality of LEDs is covered with the coating material.

According to an embodiment, the coating material includes a heat-curable resin having a light-transmissivity.

According to an embodiment, the die plate includes a plurality of grooves formed in a shape corresponding to the plurality of LEDs at a position corresponding to the plurality of LEDs, and the soaking the display module in the coating material includes inserting the plurality of LEDs into the plurality of grooves, respectively.

According to an embodiment, the coating material includes: a first coating material filled in the plurality of grooves and having a first light transmittance; and a second coating material stacked on the first coating material, and having a second light transmittance lower than the first light transmittance.

According to one or more embodiments, a display module includes a substrate comprising: a first surface disposed with a plurality of LEDs; a second surface, opposite of the first surface, that is disposed with a plurality of chips connected to the plurality of LEDs and further disposed with a coupling body. The display module further includes a molding part covering the first surface and the plurality of LEDs, and having a shape corresponding to a shape of the plurality of LEDs.

According to an embodiment, the molding part includes: a first portion formed to surround the plurality of LEDs; and a second portion positioned on an upper part of the first surface that is not disposed with the plurality of LEDs, wherein the first portion and the second portion are formed integrally.

According to an embodiment, a thickness of the first portion is smaller than a thickness of the second portion.

According to an embodiment, a first light transmittance of the first portion is higher than a second light transmittance of the second portion.

According to an embodiment, the molding part includes a heat-curable resin having a light-transmissivity.

According to one or more embodiments, a method for forming a display module, includes soaking a first surface of a substrate in a coating material, the first surface disposed with a plurality of LEDs, and the substrate further including a second surface, opposite of the first surface, that is disposed with a plurality of chips connected to the plurality of LEDs and further disposed with a coupling body; and curing the coating material while the first surface of the substrate is soaked in the coating material, the cured coating material forming a molding part that covers the first surface and the plurality of LEDs, and has a shape corresponding to a shape of the plurality of LEDs.

According to an embodiment, the molding part includes: a first portion formed to surround the plurality of LEDs; and a second portion positioned on an upper part of the first surface that is not disposed with the plurality of LEDs, wherein the first portion and the second portion are formed integrally.

According to an embodiment, a thickness of the first portion is smaller than a thickness of the second portion.

According to an embodiment, a first light transmittance of the first portion is higher than a second light transmittance of the second portion.

According to an embodiment, the coating material includes a heat-curable resin having a light-transmissivity, and the curing the coating material includes heat curing the coating material.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

To sufficiently understand configurations and effects of embodiments of the disclosure, non-limiting example embodiments of the disclosure will be explained reference to the attached drawings. However, it is to be understood that the disclosure is not limited to the embodiments disclosed below, and that the embodiments may be implemented to various forms and various modifications may be applied thereto. The descriptions of non-limiting examples embodiments are provided to fully convey the scope of the disclosure to one of ordinary skill in the art to which the disclosure pertains. For convenience of description, elements in the attached drawings have been illustrated enlarged in size compared with the actual size, and a ratio of each element may be exaggerated or reduced.

It will be further understood that when an element is disclosed as "on" or "in contact with" another element, the element may be in direct contact with or connected to another element, or may have another element present therebetween. Alternatively, when an element is described as being "directly on" or "directly connected to" another element, it is to be understood that another element may not be present therebetween. Other expressions that describe the relationship between the elements such as, for example, "between . . . " and "directly between . . . ", should be interpreted the same.

The terms such as "first," "second," and so on may be used to describe a variety of elements, but the elements should not be limited by these terms. The terms may be used only for the purpose of distinguishing one element from another. For example, a first element may be designated as a second element without departing from the scope and spirit of the present disclosure, and similarly, the second element may also be designated as the first element.

A singular expression includes a plural expression, unless otherwise specified clearly in context. It is to be understood that the terms such as "comprise" or "include" may be used herein to designate a presence of a characteristic, number, step, operation, element, component, or a combination thereof, and not to preclude a presence or a possibility of adding one or more of other characteristics, numbers, steps, operations, elements, components or a combination thereof.

The terms used in the embodiments of the disclosure may be interpreted to have meanings generally understood to one of ordinary skill in the art unless otherwise defined.

Embodiments of the disclosure may relate to providing a method for molding a display module with improved manufacturing efficiency and contrast ratio.

A structure of a molding device 1 according to an embodiment may be described below with references to FIGS. 1 to 8.

Figure 1:
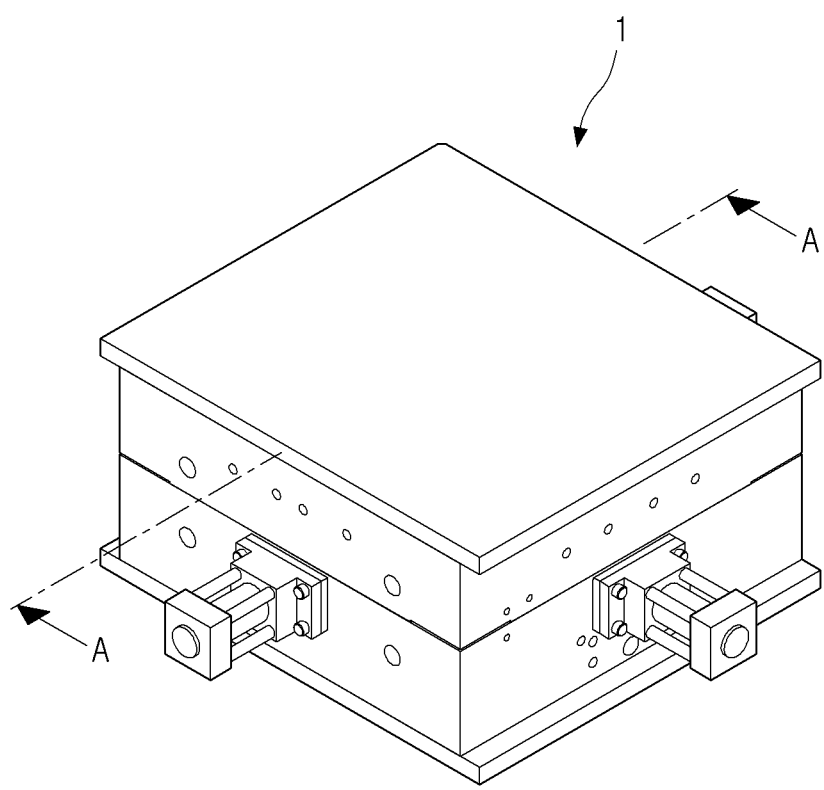
FIG. 1 is a perspective diagram illustrating a molding device according to an embodiment of the disclosure.
Figure 2:
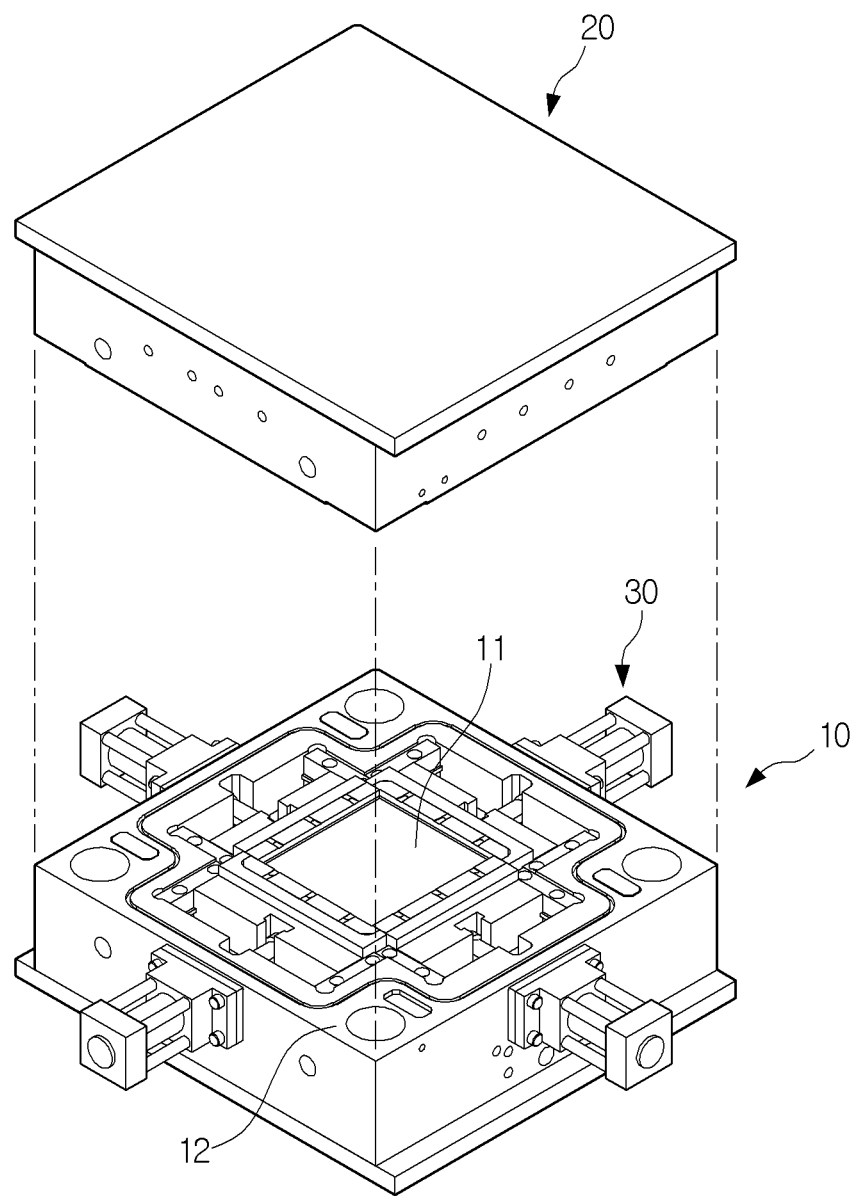
FIG. 2 is an exploded perspective diagram illustrating a molding device according to an embodiment of the disclosure.
Figure 3A:
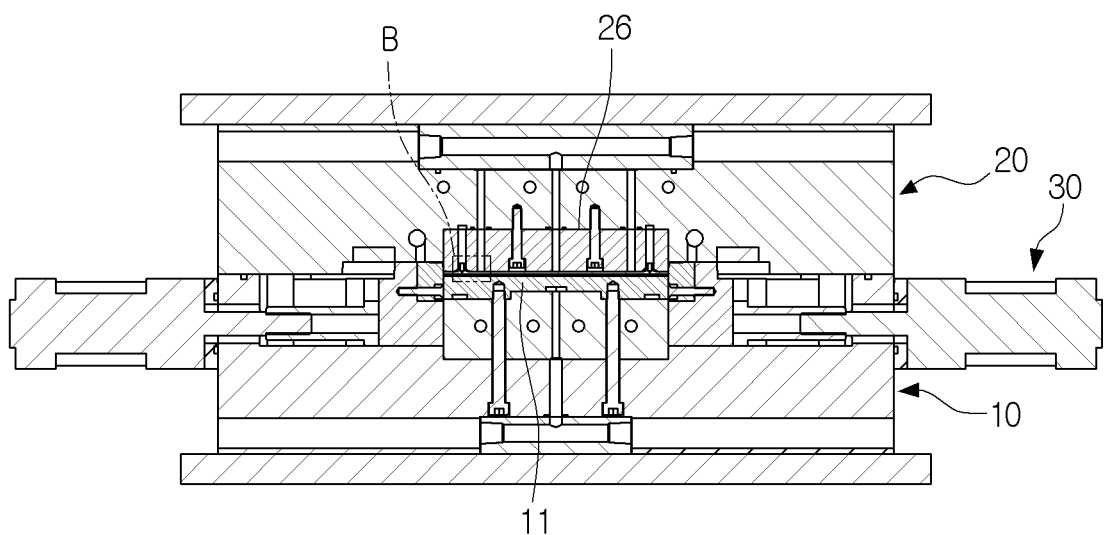
FIG. 3A is a cross-sectional diagram taken long line A-A of FIG. 1.
Figure 3B:
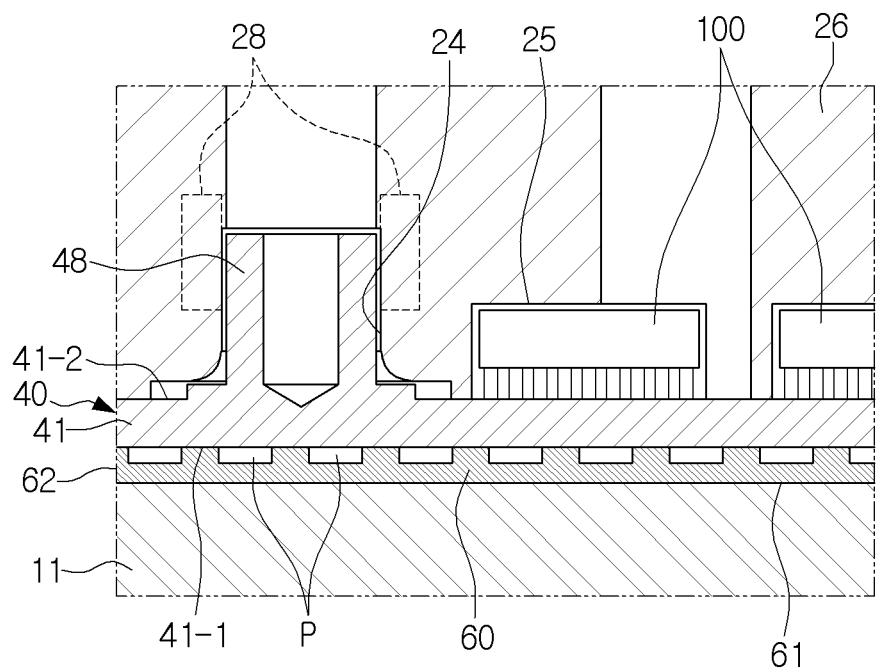
FIG. 3B is an enlarged diagram illustrating area B of FIG. 3A.
Figure 4:
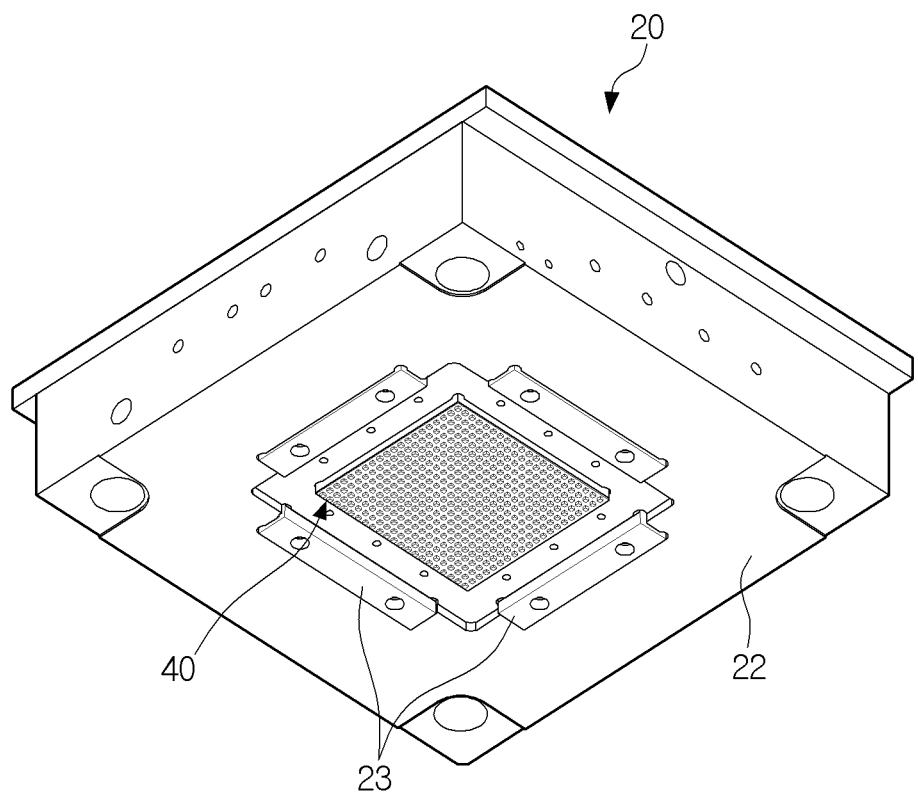
FIG. 4 is a lower perspective diagram illustrating a second die according to an embodiment of the disclosure.
Figure 5:
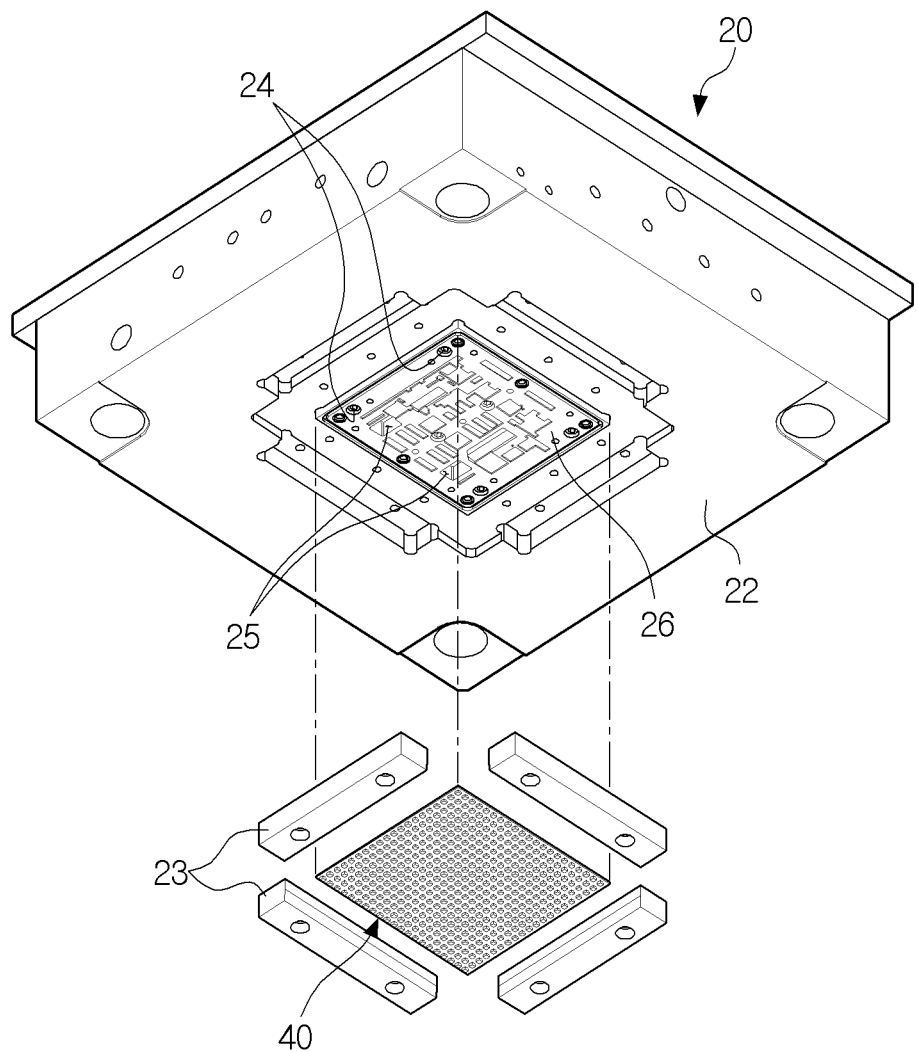
FIG. 5 is a lower exploded perspective diagram illustrating a second die according to an embodiment of the disclosure.
Figure 6:
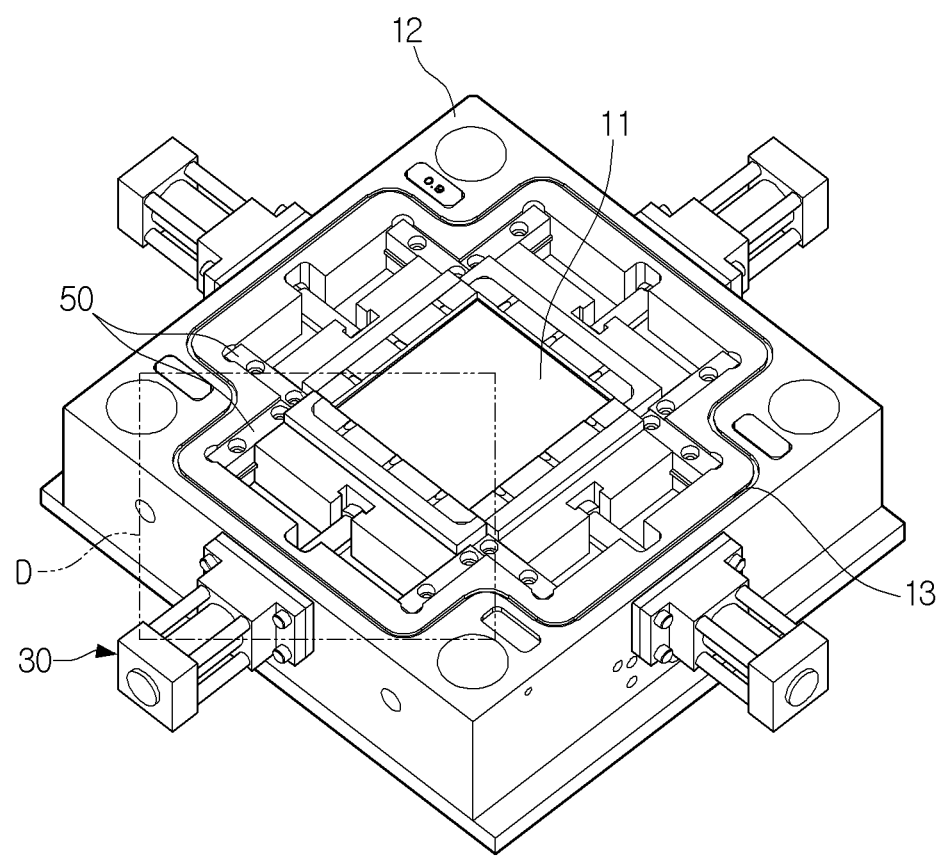
FIG. 6 is a perspective diagram illustrating a first die according to an embodiment of the disclosure.
Figure 7:
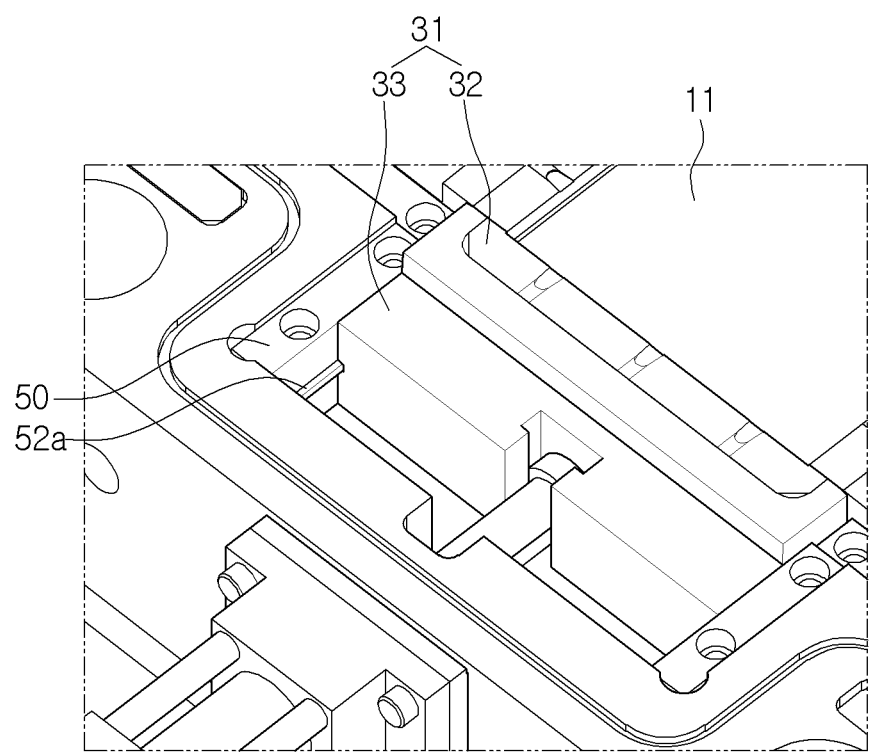
FIG. 7 is an enlarged diagram illustrating area D of FIG. 6.
Figure 8:
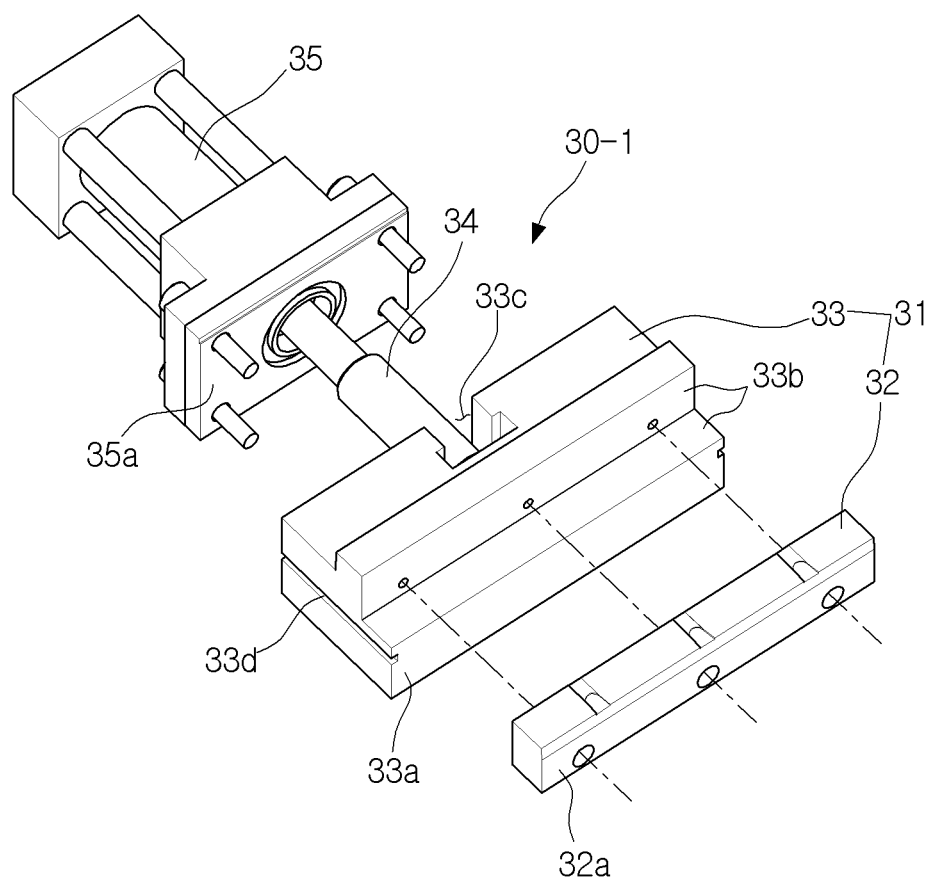
FIG. 8 is an exploded perspective diagram illustrating one side surface die according to an embodiment of the disclosure.

FIG. 1 is a perspective diagram illustrating a molding device 1 according to an embodiment of the disclosure, FIG. 2 is an exploded perspective diagram illustrating a molding device 1 according to an embodiment of the disclosure, FIG. 3A is a cross-sectional diagram taken long line A-A of FIG. 1, FIG. 3B is an enlarged diagram illustrating area B of FIG. 3A, FIG. 4 is a lower perspective diagram illustrating a second die 20 according to an embodiment of the disclosure, FIG. 5 is a lower exploded perspective diagram illustrating a second die 20 according to an embodiment of the disclosure, FIG. 6 is a perspective diagram illustrating a first die 10 according to an embodiment of the disclosure, FIG. 7 is an enlarged diagram illustrating area D of FIG. 6, and FIG. 8 is an exploded perspective diagram illustrating a first side surface die 30-1 according to an embodiment of the disclosure.

The molding device 1 may be a device molding a display module disposed with a plurality of LEDs, and may include a first die 10 and a second die 20 coupled to be detachable from the first die 10.

The die may be designating a press mold for manufacturing, and may be designated as a molding, a mold, a core, or an injection molding.

The first die 10 may be coupled with the second die 20 for molding the display module 40, and may include a die plate 11 for forming an exterior of a molding part 60 (see FIG. 3B) of the display module 40, a plurality of side surface dies 30 capable of selectively contacting with the die plate 11, a heating line 70 (see FIG. 11) capable of applying heat to the die plate 11, and a cooling line 80 (see FIG. 11) capable of cooling the die plate 11.

The die plate 11 may form a cavity C to be filled with a coating material T for molding a display module 40 together with the plurality of side surface dies 30.

Specifically, based on the plurality of side surface dies 30 contacting side surfaces of the die plate 11, the cavity C, which is a space that the coating material T may be injected, may be formed.

The shape of display module 40 may be determined according to the die plate 11 and the shape of the plurality of side surface dies 30 contacting the die plate 11.

For example, the shape of a front surface of the die plate 11 may correspond with the shape of an upper surface 61 of the molding part 60, and the shape of the plurality of side surface dies 30 may correspond with the shape of a side surface 62 of the molding part 60.

Specifically, based on the die plate 11 being formed flatly, the upper surface 61 of the molding part 60 may be formed flatly, and in case the die plate 11 has a shape of an uneven part, the uneven part may be formed on the upper surface of the molding part 60.

In addition, a size of the die plate 11 may correspond with a size of a substrate 41. Accordingly, even when the display module 40 formed with the molding part 60 on the substrate 41 is completed, a process of removing a separate molding part to fit the size of the substrate 41 may not be needed.

In addition, the first die 10 may include a first die contact surface 12 capable of contacting with a second die contact surface 22 of the second die 20. The first die contact surface 12 may have a shape complementing the second die contact surface 22.

In addition, in case the first die contact surface 12 and the second die contact surface 22 are in contact, an inner space of a molding device 1 including the die plate 11 may be sealed from the outside.

The inner space of the molding device 1 may refer to a space including the cavity C containing the coating material T.

Accordingly, in case a vacuum flow path (not shown) for vacuuming the inner space of the molding device 1 is formed, the inner space of the molding device 1 may be vacuumed when the first die 10 and the second die 20 are in contact.

In addition, referring to FIG. 6, the first die contact surface 12 may be formed with a sealing or a sealing groove 13 for inserting an O-ring. Accordingly, when the first die 10 and the second die 20 are in contact, the inner space of the molding device 1 may be completely sealed from the outside.

The plurality of side surface dies 30 may be provided on the first die 10, and provided to selectively contact the side surfaces of the die plate 11. The specific structure of the plurality of side surface dies 30 may be described hereafter with reference to FIG. 8.

Referring to FIGS. 3A-B, the display module 40 may include a first surface 41-1 disposed with a plurality of LEDs P, a plurality of chips 100 to be opposite to the first surface 41-1 and electrically connected with the plurality of LEDs P, and a substrate 41 including a second surface 41-2 disposed with a coupling member 48. The coupling member 48 may include at least one coupling body.

The plurality of LEDs P may be, as self-light emitting display elements, inorganic light emitting elements that emits light on its own, and disposed at a pre-set distance on the substrate 41.

The plurality of LEDs P may operate as one pixel, and the one pixel may include a red light emitting diode (LED) emitting a red light, a green LED emitting green light, and a blue LED emitting a blue light. In addition, the one pixel may further include a white LED in addition to the red (R)/green (G)/blue (B) LED.

Accordingly, one pixel may realize various colors through the combination of red LED, green LED, and blue LED.

Although, the plurality of LEDs of one display module has been described above as constituting one pixel, the plurality of LEDs may constitute a plurality of pixels in the embodiment.

In addition, in case the display module 40 is fixed to the second die 20, the first surface 41-1 disposed with the plurality of LEDs P may be disposed to face the die plate 11 of the first die 10.

The plurality of chips 100 may be disposed on the second surface 41-2 of the substrate 41, and may control the plurality of LEDs P. For example, the plurality of chips 100 may include various semiconductor chips such as a processor and a transistor, and provide a control signal and/or power to the plurality of LEDs P through wiring formed on the substrate 41.

In addition, the coupling member 48 may be disposed on the second surface 41-2 of the substrate 41. For example, the coupling member 48 may be configured in plurality, and disposed uniformly (or dispersingly) at a peripheral area of the substrate 41 to stably fix the display module 40 to the second die 20.

In addition, the coupling member 48 may be composed of a metal, and disposed to protrude from the second surface 41-2. Accordingly, because the coupling member 48 may be coupled to the second die 20, the display module 40 may be stably fixed to the second die 20.

Thus, the display module 40 may be conveniently detachable from the second die 20, and the molding efficiency of the display module 40 may be improved.

In addition, the coupling member 48 may fix the display module 40 to the second die 20 when molding the display module 40, and the display module 40 with the molding completed may be fixed to a tiling plate (not shown).

Accordingly, because the coupling member 48 may be used for fixing the molding of the display module 40, and fixing to constitute a display screen, the manufacturing efficiency of a display device using the display module 40 may be improved.

Referring to FIGS. 4 and 5, the second die 20 may be positioned on the upper part of the first die 10, and may move vertically relative to the first die 10. The second die 20 may include the second die contact surface 22 contacting the first die contact surface 12 of the first die 10, a first sealing member 23 sealing the inner space of the molding device 1 by contacting with the plurality of side surface dies 30, and a fixing member 26 for fixing the display module 40. The first sealing member 23 may include at least one sealing body, and the fixing member 26 may include at least one fixing body.

Figure 11:
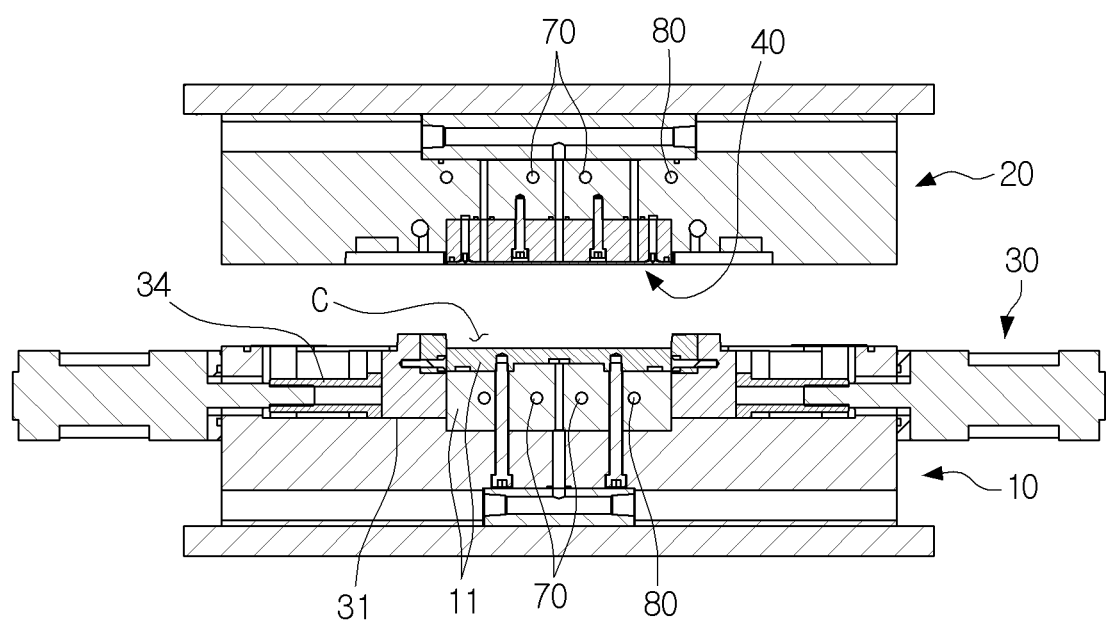
FIG. 11 is a cross-sectional diagram illustrating a state in which a die plate and a plurality of side surface dies form a cavity according to an embodiment of the disclosure.

The first sealing member 23 may be disposed around the fixing member 26, and may seal the inner space of the molding device 1 by contacting with a contact member 31 of the plurality of side surface dies 30 installed in the first die 10 (see FIG. 11). The contact member 31 may include at least one contact body.

The first sealing member 23 may be composed of rubber with elastic force, and fixed to the second die 20.

Referring to FIGS. 3A-B and 5, the fixing member 26 may be configured to fix the display module 40, and may be inserted in the second die 20.

The fixing member 26 may include a coupling hole 24 to which the coupling member 48 may be inserted, a receiving hole 25 formed in the shape of the plurality of chips 100, and a magnetic material 28 for fixing the coupling member 48.

The coupling hole 24 may correspond to the number of the coupling member 48, and may be formed at a position corresponding to a position where the coupling member 48 is protrudingly disposed. Accordingly, when the coupling member 48 is inserted into the coupling hole 24, the coupling member 48 may be fixed into the coupling hole 24 by the magnetic material 28 disposed adjacently to the coupling hole 24.

Thus, because the display module 40 is conveniently detachable to the second die 20, the molding efficiency of the display module 40 may be improved.

In the case the magnetic material 28 is not provided, the coupling member 48 may be fitted-coupled to the coupling hole 24, or thread-coupled.

The receiving hole 25, as a space for containing the plurality of chips 100, may be a shape corresponding to the position and shape of the pre-set plurality of chips 100.

Accordingly, even when the second die 20 is in contact relative to the first die 10 when the display module 40 is fixed to the second die 20, because the fixing member 26 receives pressure, the plurality of chips 100 inserted into the receiving hole 25 may be prevented from becoming damaged.

The shape of the receiving hole 25 may be varied, and the fixing member 26 may also be changed according to the display module 40 for molding.

As illustrated in FIGS. 6 to 9, the plurality of side surface dies 30 may be configured in plurality. For example, the plurality of side surface dies 30 may include a first side surface die to a fourth side surface die 30-1, 30-2, 30-3 and 30-4.

However, for convenience of description, FIG. 8 is described based on the first side surface die 30-1, but the configuration of the first side surface die 30-1 is the same as the configurations of the second side surface to the fourth side surface die 30-2, 30-3 and 30-4.

The first side surface die 30-1 may include the contact member 31 contacting the die plate 11, and an actuator 35 axis-coupled with the contact member 31 and may move the contact member 31.

The contact member 31 may be in selective contact with the side surfaces of the die plate 11 to form cavity C together with the die plate 11. In addition, the contact member 31 may include a second sealing member 32 directly contacting the die plate 11, and a connecting member 33 connecting the second sealing member 32 with an axis 34 of the actuator 35.

The second sealing member 32 may form the cavity C together with the die plate 11, and may seal a side surface of the cavity so that the coating material T filling the cavity C does not leak.

For example, the second sealing member 32 may be formed of a rubber with elastic force. The second sealing member 31 may include at least one sealing body.

In addition, in the case the second sealing member 32 may be fixed to the connecting member 33, a first contact surface 32a of the second sealing member 32 and a second contact surface 33a of the connecting member 33 may form one flat surface.

Accordingly, the first contact surface 32a and the second contact surface 33a may contact the die plate 11 to form the cavity C and simultaneously seal the side surface of the cavity C so that the coating material T filling the cavity C does not leak.

The connecting member 33 may include a seating part 33b that seats and fixes the second sealing member 32, a coupling groove 33c that receives and fixes the axis 34, and a guide slot 33d that guides the movement of the contact member 31 and is formed on both side surfaces.

The coupling groove 33c may be configured to a shape for the actuator 35 to insert and fix one end of the axis 34, and may move the contact member 31 along the movement of the axis 34.

The guide slot 33d may receive a guide protruding part 52a of the guide member 50 as illustrated in FIG. 7, and move along the guide protruding part 52a. The guide member 50 may include at least one guide body.

Accordingly, even if the contact member 31 receives power by the axis 34, the contact member 31 may not be inclined toward one side and may be guided to have stable movement by connection with the guide member 50.

The guide member 50 may be provided on the first die 10 and may be slidably-coupled with the contact member 31 to guide the contact member 31. Specifically, a respective one of the guide member 50 may be disposed on each of the both sides of the side surface dies 30 and may guide the side surface dies 30.

For example, the guide protruding part 52a may be formed on one side of the guide member 50, and the guide protruding part 52a may be inserted into the guide slot 33d of the contact member 31 and the contact member 31 may be moved.

The actuator 35 may have a configuration for controlling power to the first side surface die 30, and may be formed in various configurations such as a motor. The actuator 35 may be disposed on each of the side surfaces of the first die 10.

For example, a coupling surface 35*a* of the actuator 35 may be fixed to the side surface of the first die 10.

The process of forming the cavity C according to an embodiment will be described below with references to FIGS. 9 to 10.

Figure 9:
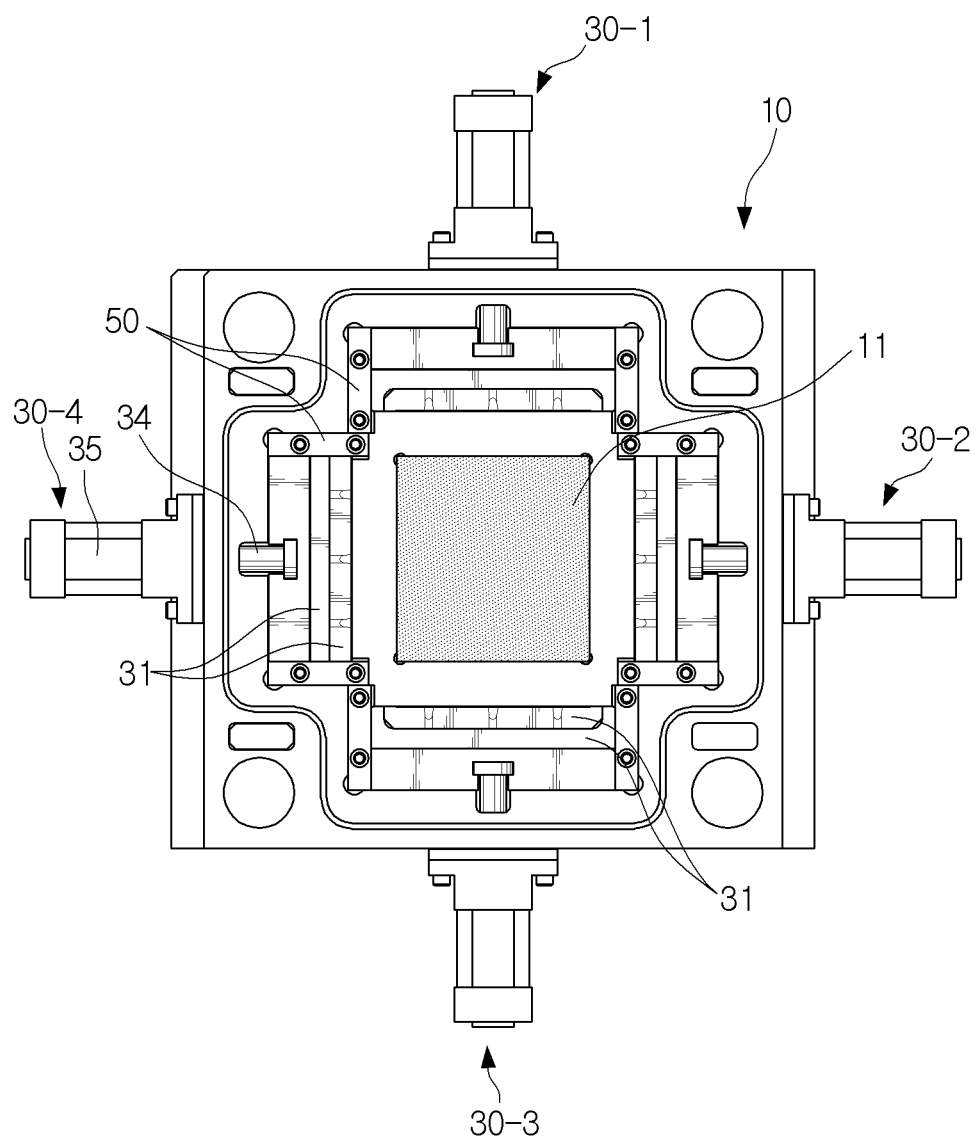
FIG. 9 is an upper surface diagram illustrating a state in which a die plate and a plurality of side surface dies are spaced apart according to an embodiment of the disclosure.
Figure 10:
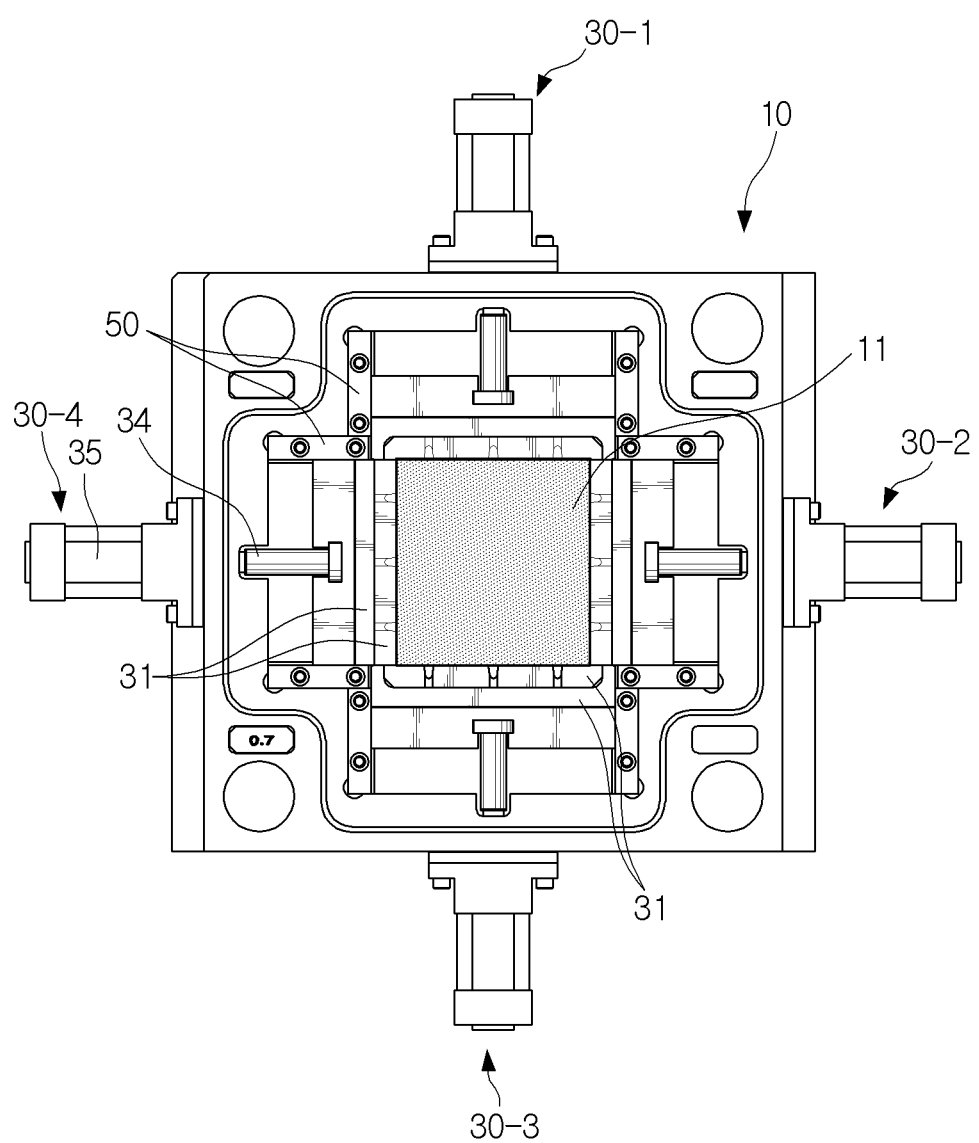
FIG. 10 is an upper surface diagram illustrating a state in which a die plate and a plurality of side surface dies are in contact according to an embodiment of the disclosure.

FIG. 9 is an upper surface diagram illustrating a state in which a die plate 11 and a plurality of side surface dies 30 are spaced apart according to an embodiment of the disclosure, and FIG. 10 is an upper surface diagram illustrating a state in which a die plate 11 and a plurality of side surface dies 30 are in contact according to an embodiment of the disclosure.

First, as illustrated in FIG. 9, a first side surface die to a fourth side surface die 30-1, 30-2, 30-3, and 30-4 may be in a first state of being spaced apart at predetermined intervals with the die plate 11.

Specifically, the contact member of each of the first side surface die to the fourth side surface die 30-1, 30-2, 30-3, and 30-4 may be in a state of being spaced apart with the die plate 11. That is, the cavity C may not be in a formed state in the first state.

Next, as illustrated in FIG. 10, the first side surface die to the fourth side surface die 30-1, 30-2, 30-3, and 30-4 may be moved to be in contact with the die plate 11.

Specifically, the actuator 35 of each of the first side surface die to the fourth side surface die 30-1, 30-2, 30-3, and 30-4 may move the contact member 31 through the axis 34. Accordingly, the contact member 31 may contact the die plate 11 by being guided by the guide member 50.

That is, as illustrated in FIG. 10, the first side surface die to the fourth side surface die 30-1, 30-2, 30-3, and 30-4 may be in a second state of being in contact with the die plate 11.

Based on the contact member 31 contacting the die plate 11, the contact member 31 and the die plate 11 may then form the cavity C, which is a space for the coating material T to be filled.

That is, the cavity C may be formed as the plurality of side surface dies 30 are moved to contact the die plate 11.

For example, the cavity C may refer to a rectangular parallelepiped space due to the shape of the contact member 31 and the die plate 11.

A method for molding a display module 40 according to an embodiment may be described in greater detail below with references to FIGS. 11 to 15 and 21.

Figure 12A:
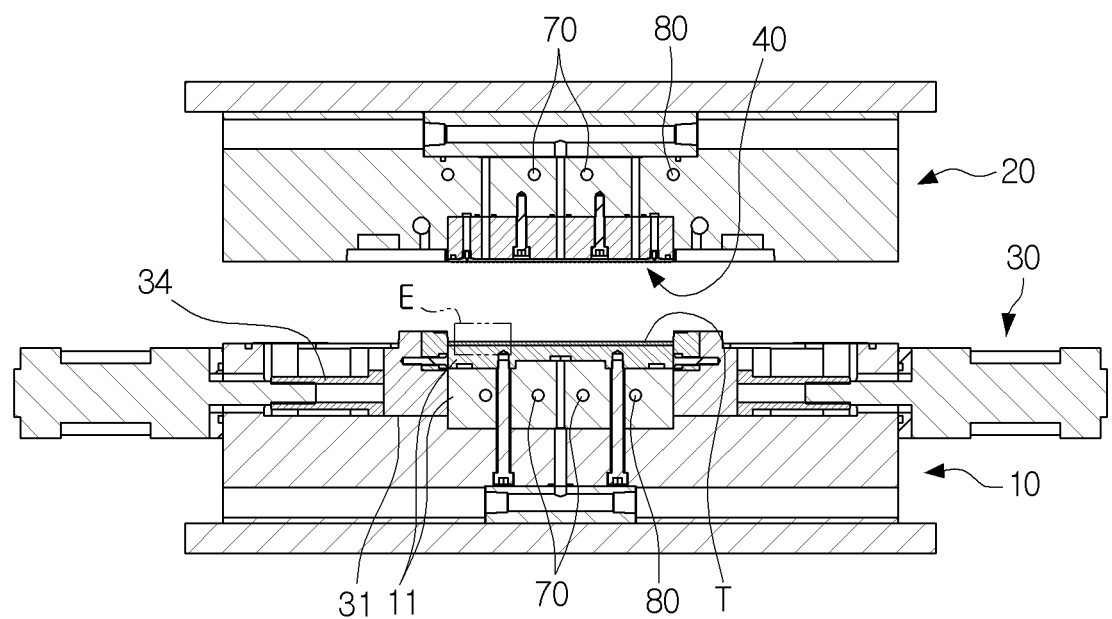
FIG. 12A is a cross-sectional diagram illustrating a state in which a cavity is filled with a coating material according to an embodiment of the disclosure.
Figure 12B:
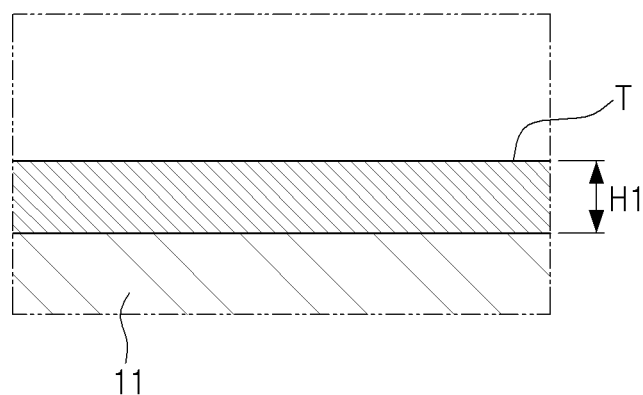
FIG. 12B is an enlarged diagram illustrating area E of FIG. 12A.
Figure 13A:
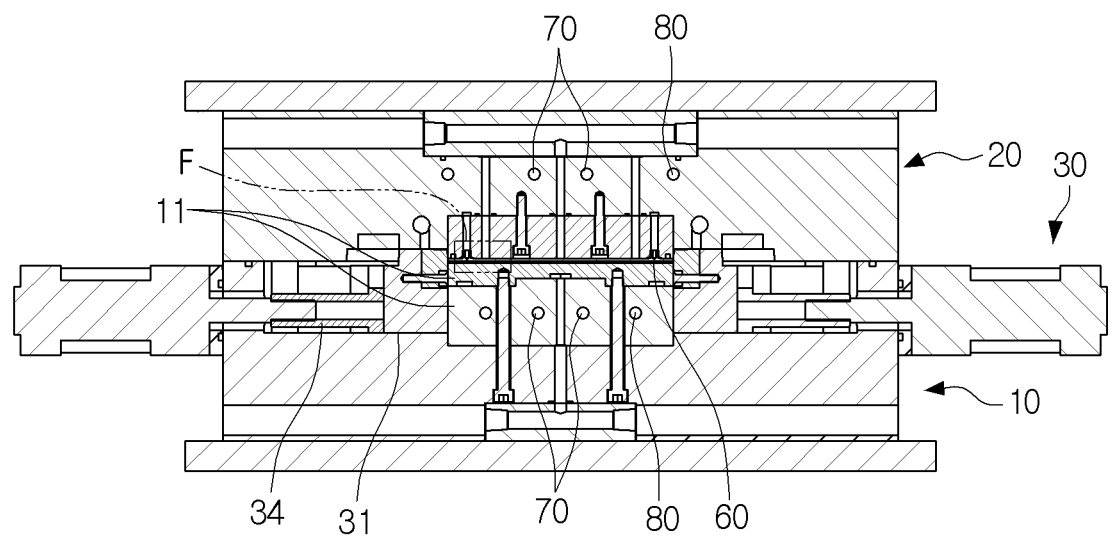
FIG. 13A is a cross-sectional diagram illustrating a state in which a first die and a second die are coupled according to an embodiment of the disclosure.
Figure 13B:
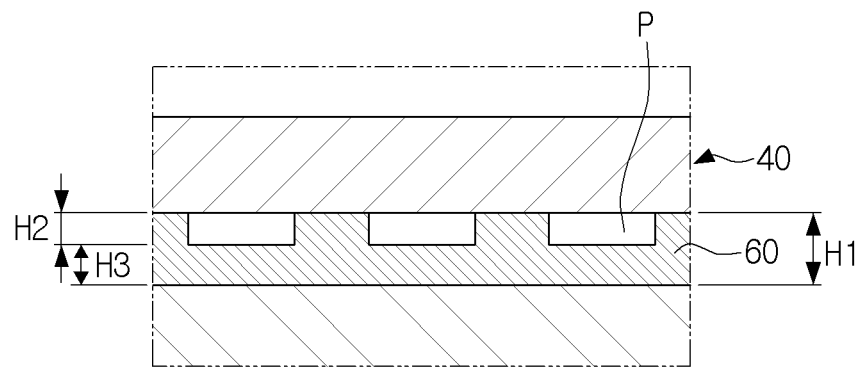
FIG. 13B is an enlarged diagram illustrating area F of FIG. 13A.
Figure 14:
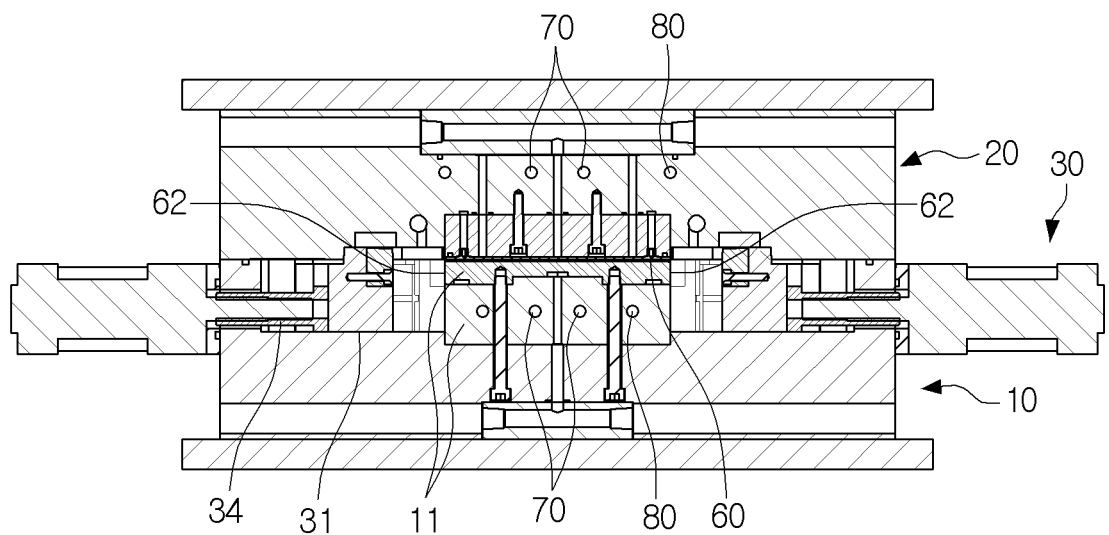
FIG. 14 is a cross-sectional diagram illustrating a state in which a plurality of side surface dies has moved in the state illustrated in FIG. 13A.
Figure 15:
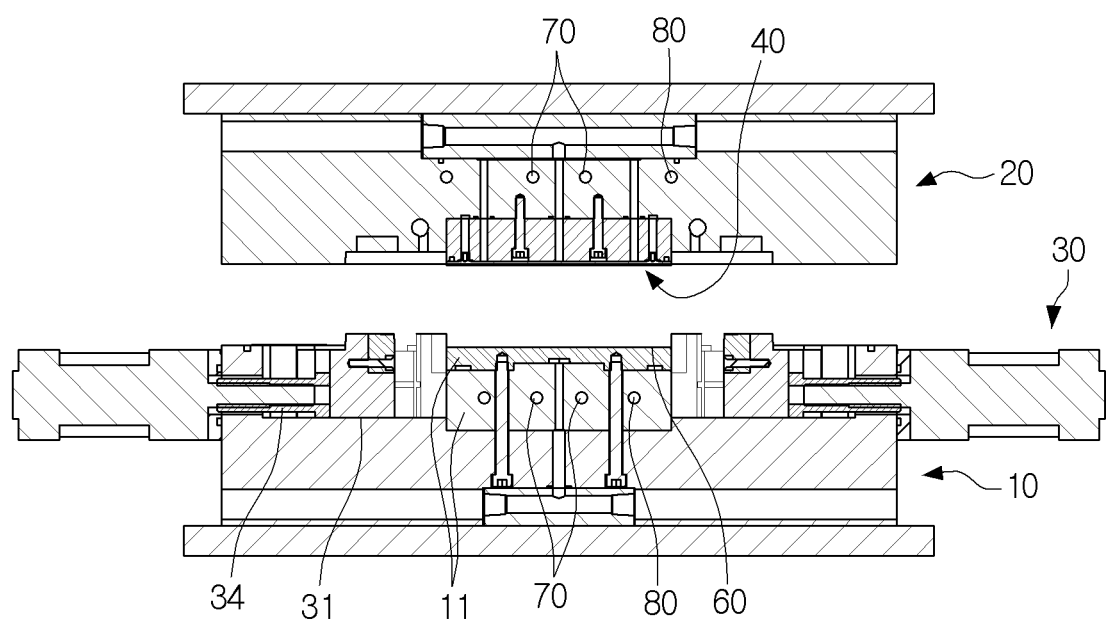
FIG. 15 is a cross-sectional diagram illustrating a state in which a first die and a second die are spaced apart according to an embodiment of the disclosure.
Figure 21:
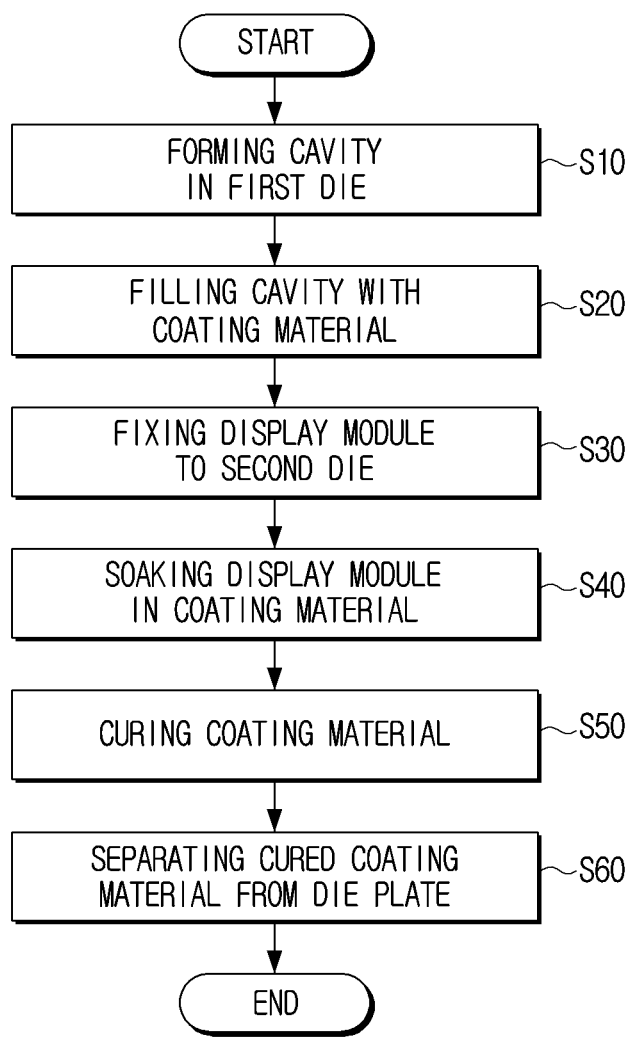
FIG. 21 is a flowchart illustrating a method for molding a display module according to an embodiment of the disclosure.

FIG. 11 is a cross-sectional diagram illustrating a state in which a die plate 11 and a plurality of side surface dies 30 form a cavity C according to an embodiment of the disclosure, FIG. 12A is a cross-sectional diagram illustrating a state in which a cavity C is filled with coating material T according to an embodiment of the disclosure, FIG. 12B is an enlarged diagram illustrating area E of FIG. 12A, FIG. 13A is a cross-sectional diagram illustrating a state in which a first die 10 and a second die 20 are coupled according to an embodiment of the disclosure, FIG. 13B is an enlarged diagram illustrating area F of FIG. 13A, FIG. 14 is a cross-sectional diagram illustrating a state in which a plurality of side surface dies 30 has moved in the state illustrated in FIG. 13A, FIG. 15 is a cross-sectional diagram illustrating a state in which a first die 10 and a second die 20 are spaced apart according to an embodiment of the disclosure, and FIG. 21 is a flowchart illustrating a method for molding a display module 40 according to an embodiment of the disclosure.

First, as illustrated in FIG. 11, the cavity C may be formed using the die plate 11 of the first die 10 and the plurality of side surface dies 30 (S10).

Specifically, the contact member 31 of the plurality of side surface dies 30 may contact the side surface of the die plate 11 to form the cavity C, which is a space in which the coating material T may be injected.

Next, as illustrated in FIGS. 12A-B, the coating material T may be filled in the formed cavity C (S20).

The coating material T may include a heat-curable resin having a light-transmissivity. Accordingly, the coating material T may be in a state of having a predetermined viscosity at room temperature, and when heat is applied to the coating material T, the coating material T may be cured.

In addition, the coating material may include a binder resin, a photopolymerization initiator, a black pigment and a solvent, or may be comprised of a resin composition including black pigment for shielding.

Accordingly, because the coating material T constitutes the plurality of LEDs P and the molding part 60 that covers the substrate disposed with the plurality of LEDs P, the outside light introduced to the display module 40 may be absorbed while simultaneously improving contrast ratio, and by protecting the plurality of LEDs P, the plurality of LEDs P may be prevented from being damaged by moisture, static, and the like.

In addition, the coating material T may be formed to a first height H1 on the die plate 11. The first height H1 may be higher than a second height H2 of the plurality of LEDs P covering all of the upper surface and the side surfaces of the plurality of LEDs P.

That is, in the operation of injecting the coating material to the cavity (S20), the coating material T may be injected to be higher than the height of the plurality of LEDs P disposed on the first surface 41-1 of the display module 40.

Next, the display module 40 may be fixed to the second die 20 (S30). The display module 40 may be in a state in which the plurality of LEDs P is disposed on the first surface 41-1 of the substrate 41, and the plurality of chips 100 is disposed on the second surface 41-2.

Specifically, the display module 40 may be fixed to the second die 20 through the coupling member 48 disposed on the second surface 41-2 opposite to the first surface 41-1 disposed with the plurality of LEDs P.

For example, because the coupling member 48 formed on the second surface 41-2 is inserted into the coupling hole 24 formed on the fixing member 26 of the second die 20, the display module 40 may be fixed to the second die 20.

Because the plurality of chips 100 is inserted into the receiving hole 25 which is formed to the shape of the plurality of chips 100 on the fixing member 26, damage to the plurality of chips 100 may be prevented even when being downward pressed as the second die 20 and the first die 10 are in contact.

As illustrated in FIG. 13B, the display module 40 may then be soaked in the coating material T (S40). Specifically, the second die 20 may, when the display module 40 is in a fixed state, be moved to be in contact with the first die 10.

The second die 20 may be moved until the coating material T filled in the cavity C covers all of the first surface 41-1 and the plurality of LEDs P. That is, the first surface 41-1 may contact the coating material T until the side surfaces of the plurality of LEDs P are covered.

For example, the second die 20 may move toward the first die 10 so that a sum of the second height H2 of the plurality of LEDs P and the third height H3 of the coating material T on the plurality of LEDs P is the same as the first height H1 at which the coating material T is in contact with the first surface 41-1.

In addition, when the first die 10 and the second die 20 are in contact, the cavity C may be sealed from the outside, and when a vacuum line (not shown) is formed on the molding device 1, the inside may become vacuumed.

Accordingly, as the air bubbles within the coating material T are released to the outside by vacuuming, air bubbles being present inside the molding part 60 may be prevented. Thus, light emitted from the plurality of LEDs P may be prevented from diffusing or refracting due to the air bubbles, and a uniform brightness of the display screen may be realized.

Next, as illustrated in FIG. 14, the coating material T may be cured as the display module 40 is in a soaked state in the coating material T (S50). Specifically, the coating material T may receive heat from a heating line 70 provided in the first die 10 thereby rising in temperature, and the heat-curable coating material T may be cured.

The heating line 70 may be sufficient if provided on the first die 10 to apply heat to the coating material T, and the method of heating may be varied. In addition, the heating line 70 may not be limited to being formed on the first die 10, but may also be formed on the second die 20.

Accordingly, based on applying heat to the coating material T, the coating material T may be cured when the plurality of LEDs P and the first surface 41-1 of the display module 40 is covered and may form the molding part 60.

The molding part 60 that is cured may then be cooled through a cooling line 80 provided in the second die 20 thereby lowering in temperature. That is, after the coating material T is cured, the coating material T may be cooled. The cooling line 80 may be sufficient if provided on the first die 10 to cool the molding part 60, and the method of cooling may be varied.

In addition, the cooling line 80 may not be limited to being formed on the first die 10, but may also be formed on the second die 20. In addition, the heating line 70 and the cooling line 80 may be formed with the same line, and the heating or cooling may be selectively performed according to the temperature of the fluid flowing in the corresponding line.

Accordingly, by cooling the molding part 60 that is at a high temperature, separating the molding part 60 from the die plate 11 and the plurality of side surface dies 30 may be easily performed.

Next, as illustrated in FIGS. 14 to 15, the coating material T of the display module 40 that is cured may be separated from the die plate 11 (S60).

First, as illustrated in FIG. 14, the plurality of side surface dies 30 may be spaced apart from the die plate 11. Specifically, the contact member 31 of the plurality of side surface dies 30 may be spaced apart from the side surface 62 of the molding part 60.

Next, as illustrated in FIG. 15, the second die 20 may move relative to the first die 10, and the molding part 60 may be separated from the die plate 11. Specifically, the upper surface 61 of the molding part 60 may be separated from the die plate 11.

Accordingly, the molding part 60 may be separated from the die plate 11 and the plurality of side surface dies 30.

Thus, by forming the molding part 60 through the mold method, time required for forming the molding part 60 may be significantly reduced, and since the coating material T is a quantitative amount filling the cavity C, the amount of coating material T may also be reduced, thereby improving the manufacturing efficiency of the display module 40 significantly.

A structure of the display module 40 constructed through the method for molding the display module illustrated in FIGS. 11 to 15 may be described below.

Figure 16:
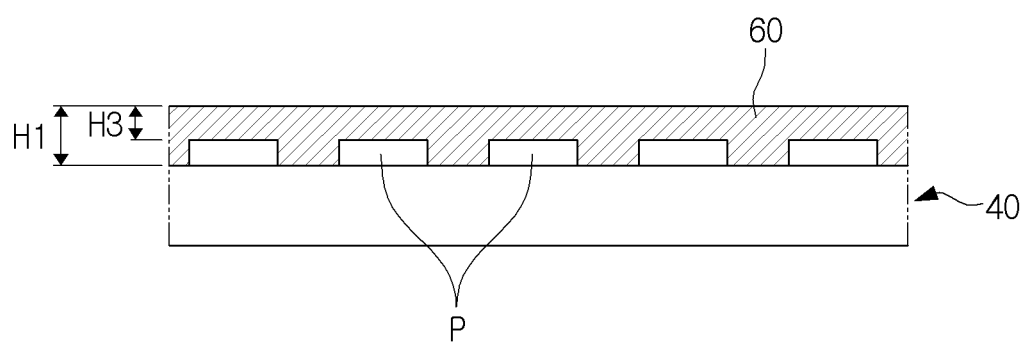
FIG. 16 is a cross-sectional diagram illustrating a display module according to an embodiment of the disclosure.

FIG. 16 is a cross-sectional diagram illustrating a display module 40 according to an embodiment of the disclosure.

The display module 40 may cover the first surface 41-1 and the plurality of LEDs P, and may include the molding part 60 with the shape corresponding to the shape of the plurality of LEDs P.

The upper surface of the molding part 60 may be formed flatly. Accordingly, as the light emitted from the plurality of LEDs P is not refracted by the molding part 60, a uniform brightness of the display screen may be realized.

In addition, the molding part may be composed of a material that absorbs outside light, and by absorbing the outside light, the contrast ratio of the display screen may be improved.

Further, by forming the molding part 60 that is cured and covers the plurality of LEDs P and the first surface 41-1 on the substrate 41 disposed with the plurality of LEDs P, the plurality of LEDs P may be protected from outside moisture, static and the like, and the lifespan of the display module 40 may be improved.

A molding device 1' and a display module 40' manufactured by the molding device 1' according to a modified embodiment may be described below with references to FIGS. 17A to 18.

Figure 17A:
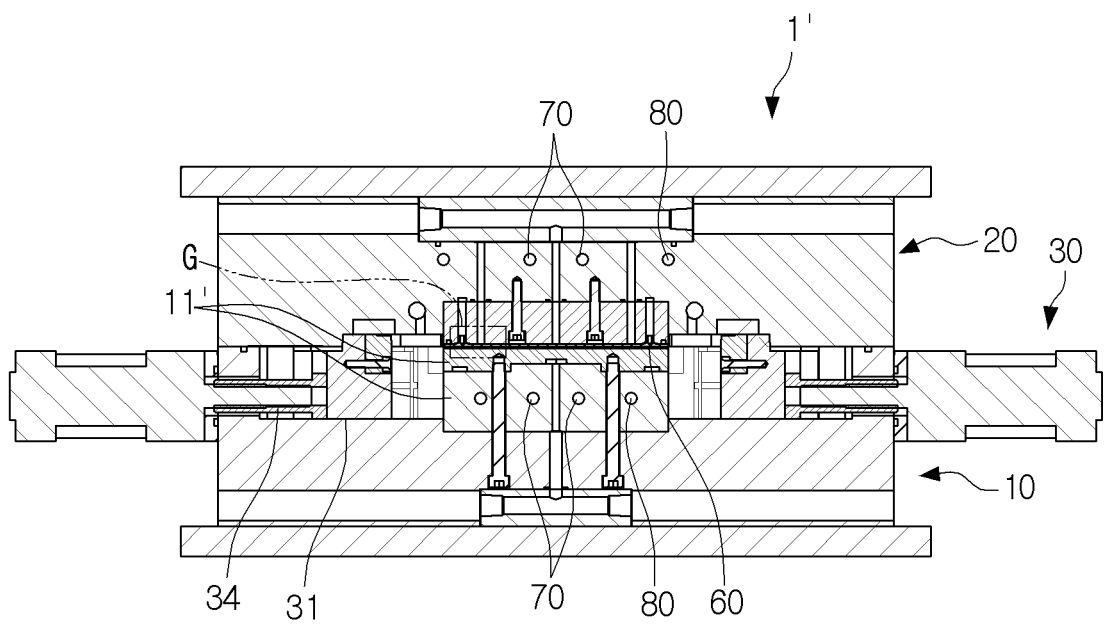
FIG. 17A is a cross-sectional view illustrating a molding device according to a modified embodiment of the disclosure.
Figure 17B:
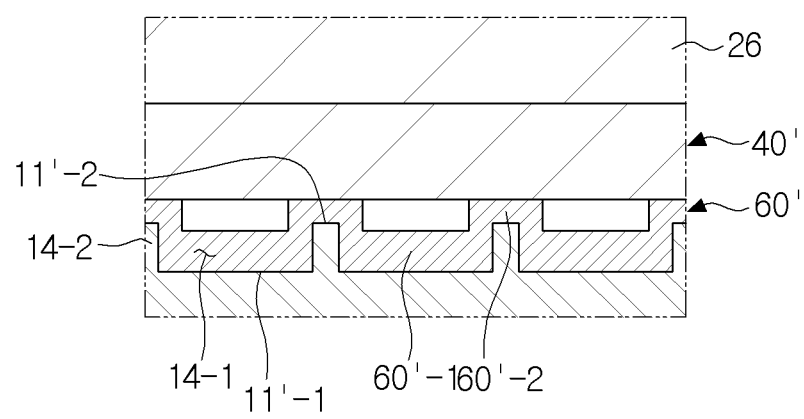
FIG. 17B is an enlarged diagram illustrating area G of FIG. 17A.
Figure 18:
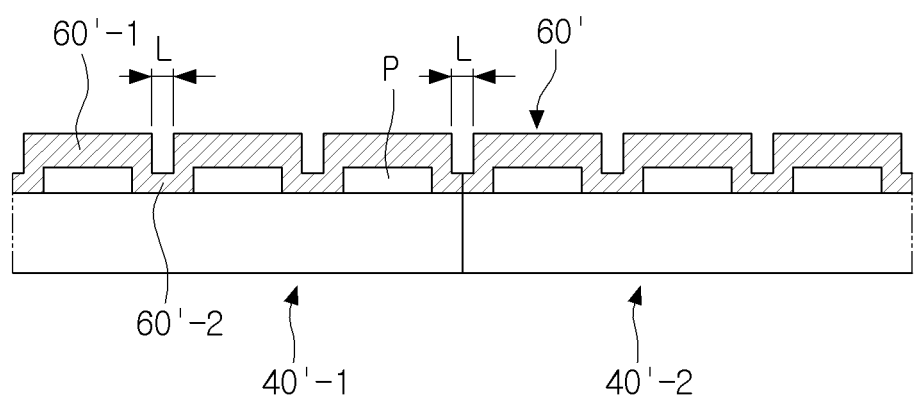
FIG. 18 is a cross-sectional diagram illustrating a display module according to a modified embodiment of the disclosure.

FIG. 17A is a cross-sectional view illustrating a molding device according to a modified embodiment of the disclosure, FIG. 17B is an enlarged diagram illustrating area G of FIG. 17A, and FIG. 18 is a cross-sectional diagram illustrating a display module 40' according to a modified embodiment of the disclosure.

Hereinbelow, like reference numerals have been used for like configurations, and overlapping descriptions have been omitted. For example, the first die 10, the second die 20, the plurality of side surface dies 30, and the fixing member 26 are the same as described above, and overlapping descriptions have been omitted.

The die plate 11' may include a plurality of grooves 14-1 formed to a shape corresponding to the plurality of LEDs P at the position corresponding to the plurality of LEDs P. Accordingly, the operation of soaking a display module 40' in the coating material T may further include an operation of inserting the plurality of LEDs P respectively into the plurality of grooves 14-1.

Specifically, as illustrated in FIG. 17B, the die plate 11' may include the plurality of grooves 14-1 and a protruding part 14-2 formed between the plurality of grooves.

Accordingly, by filling the die plate 11' with coating material T having viscosity, a molding part 60' with a first portion 60'-1 and a second portion 60'-2 may be formed by the plurality of grooves 14-1 and the protruding part 14-2.

Specifically, the molding part 60' may include a first portion 60'-1 protrudingly formed to surround the plurality of LEDs P and a second portion 60'-2 positioned on the upper part of the first surface 41-1 not disposed with the plurality of LEDs P.

The first portion 60'-1 may be formed by the plurality of grooves 14-1, and the second portion 60'-2 may be formed by the protruding part 14-2. That is, the first portion 60'-1 and the second portion 60'-2 may be a shape complementary to the die plate 11' including the plurality of grooves 14-1 and the protruding part 14-2.

Further, the first portion 60'-1 and the second portion 60'-2 may be formed integrally with the same material.

In addition, the shape of the plurality of grooves 14-1 may be a rectangular parallelepiped shape. That is the die plate 11' may include a surface with an uneven part pattern, which is the rectangular parallelepiped shape.

Accordingly, as illustrated in FIG. 18, a first display module 40'-1 and a second display module 40'-2 including the molding part 60' formed by the die plate 11' including the plurality of grooves 14-1 and the protruding part 14-2 may be disposed side by side.

The gap in the first portion 60'-1 may include a pre-set spacing distance L. The spacing distance L may correspond with the widthwise length of the protruding part 14-2.

The distance between the gap of the first portion 60'-1 disposed on the edge of the second display module 40'-2 adjacent with the first portion 60'-1 disposed on the edge of a first display module 40'-1 may be the same as the pre-set spacing distance L.

That is, in case the display modules formed with the molding part 60' including the first portion 60'-1 and the second portion 60'-2 are arranged side by side to form a large scale screen, the distance of the gaps of the first portion 60'-1 may all satisfy the pre-set spacing distances L.

Accordingly, even when viewing a screen implemented by the plurality of display modules, a user may not recognize a seam between the plurality of display modules due to the pattern with all of the same spacing distances L.

In addition, because the molding part 60' absorbs outside light by being composed of a material that absorbs outside light, a seamless screen configured by the plurality of display modules may be realized.

According to another embodiment, the first portion 60'-1 and the second portion 60'-2 may be composed of materials different from each other. Specifically, a first light transmittance of the first portion 60'-1 may be higher than a second light transmittance of the second portion 60'-2.

That is, the coating material T may be filled in the plurality of grooves 14-1, and may include a first coating material with the first light transmittance and a second coating material stacked on the first coating material with the second light transmittance, which is lower than the first light transmittance.

Specifically, the first coating material with the first light transmittance may be first injected in the plurality of grooves 14-1, and by stacking the second coating material with the second light transmittance on the upper part of the first coating material, the coating material T may be formed.

The first light transmittance of the first portion 60'-1 may then be higher than the second light transmittance of the second portion 60'-2 through the method for molding the display module according to FIGS. 11 to 15.

The coating material T including the black pigment may absorb outside light better the lower the light transmittance.

Thus, the first portion 60'-1 surrounding the plurality of LEDs P may realize a display screen without loss of light emitting from the plurality of LEDs P due to the first portion 60'-1 with high light transmittance.

Simultaneously, because the second portion 60'-2 of an area not disposed with the plurality of LEDs P may absorb outside light better compared to the first portion 60'-1, the gap of the plurality of LEDs P may be configured to not be visible externally.

Further, considering that the plurality of display modules may be arranged to implement a large scale display screen, a predetermined brightness or more of the plurality of LEDs P concurrently with a seamless display may be realized.

A molding device 1" and a display module 40" manufactured by the molding device 1" according to another modified embodiment will be described below.

Figure 19A:
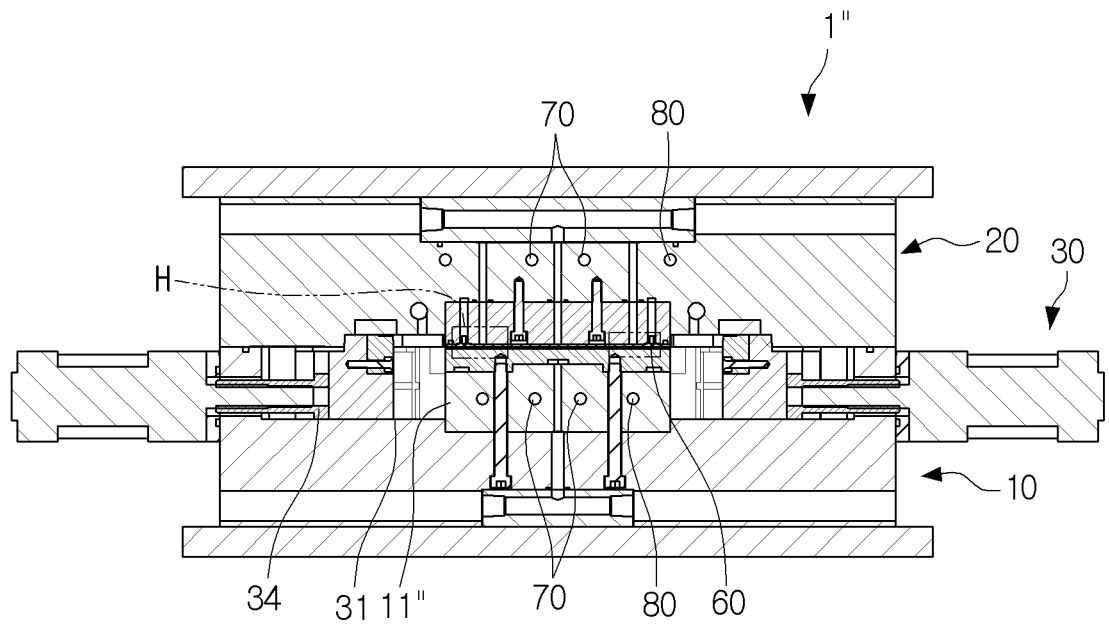
FIG. 19A is a cross-sectional diagram illustrating a molding device according to another modified embodiment of the disclosure.
Figure 19B:
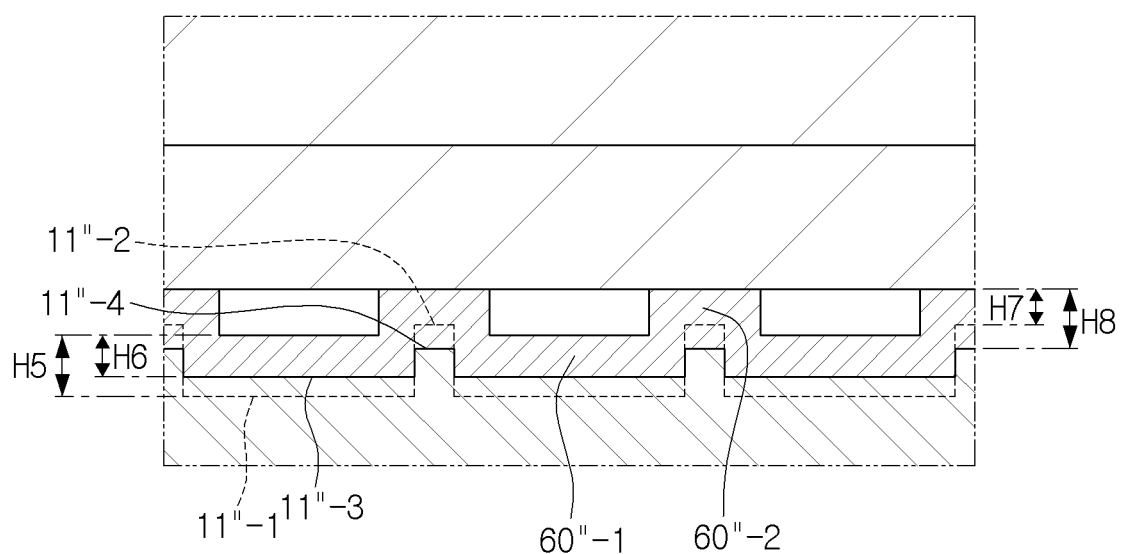
FIG. 19B is an enlarged diagram illustrating area H of FIG. 19A.
Figure 20:
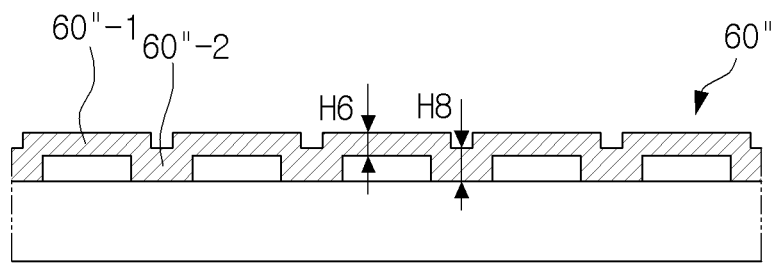
FIG. 20 is a cross-sectional diagram illustrating a display module according to another modified embodiment of the disclosure.

FIG. 19A is a cross-sectional diagram illustrating a molding device 1" according to another modified embodiment of the disclosure, FIG. 19B is an enlarged diagram illustrating area H of FIG. 19A, and FIG. 20 is a cross-sectional diagram illustrating a display module 60" according to another modified embodiment of the disclosure.

Hereinbelow, like reference numerals have been used for like configurations, and overlapping descriptions have been omitted. For example, the first die 10, the second die 20, the plurality of side surface dies 30, and the fixing member 26 are the same as described above, and overlapping descriptions have been omitted.

A thickness of a first portion 60"-1 may be smaller than a thickness of a second portion 60"-2 on a die plate 11".

For example, as illustrated in FIG. 19B, a sixth height H6 corresponding to the thickness of the first portion 60"-1 may be smaller than a seventh height H7 corresponding to the thickness of the second portion 60"-2.

That is, the sixth height H6 may refer to the length from the upper surface of the plurality of LEDs P to an upper surface 11"-3 of the plurality of grooves, and the seventh height H7 may refer to the length from the first surface 41-1 of the substrate 41 to an upper surface 11"-2 of the protruding part.

Further, the sixth height H6 may be smaller than a fifth height H5 of the first portion 60'-1 illustrated in FIGS. 17B to 18, and the seventh height H7 may be smaller than an eighth height H8 of the second portion 60'-2 illustrated in FIGS. 17B to 18.

Accordingly, as illustrated in FIG. 20, because the sixth height H6 of the first portion 60"-1 is smaller than the eighth height H8 of the second portion 60"-2, the light transmittance of the first portion 60"-1 may be better than the light transmittance of the second portion 60"-2, and an outside light absorption rate of the first portion 60"-1 may be smaller than an outside light absorption rate of the second portion 60"-2.

Accordingly, the first portion 60"-1 surrounding the plurality of LEDs P may realize a display screen without loss of light emitting from the plurality of LEDs P due to the first portion 60"-1 with high light transmittance.

Simultaneously, because the second portion 60"-2 of an area not disposed with the plurality of LEDs P may absorb outside light better compared to the first portion 60"-1, the gap of the plurality of LEDs P may be configured to not be visible externally.

Further, considering that the plurality of display modules may be arranged to implement a large scale display screen, a predetermined brightness or more of the plurality of LEDs P concurrently with a seamless display may be realized.

According to another embodiment, if one of the plurality of LEDs P of the display module 40 is faulty, an exchange of the faulty LED may also be performed through the molding method.

For example, based on one LED of the display module 40 being faulty, the corresponding LED and the molding part 60 adjacent to the LED may be removed. The method for removing the molding part 60 such as physical removal method and chemical removal method may be varied according to necessity.

A new LED may then be disposed on the substrate 41 to the position corresponding to the faulty LED. The disposing the new LED on the substrate 41 may include connecting the gap between the new LED and the substrate 41 electrically and physically.

Next, a coating material is filled into an empty space of the molding part 60, that is removed, adjacent to the corresponding LED, and the corresponding portion may be cured by pressing and heating through a die.

In addition, a unit molding part of one unit adjacent to one LED may be manufactured in plurality through the molding method, and the corresponding manufactured unit molding part may be inserted and fixed in the empty space of the molding part 60, that is removed, adjacent to the corresponding LED.

The unit molding part may be a shape corresponding to the first portion 60-1 surrounding to one LED.

In the above, various embodiments of the disclosure have been described respectively and individually, but each embodiment may not necessarily be implemented on its own, and the configuration and operations of each embodiments may be implemented in combination with at least one other embodiment.

Further, while the present disclosure has been illustrated and described with reference to various example embodiments thereof, the present disclosure is not limited to the specific embodiments described. It will be understood by those skilled in the art that various changes in form and details may be made therein without departing from the spirit and scope of the disclosure.

What is claimed is:

1. A method for molding a display module, the method comprising:
   forming a cavity using a die plate of a first die and a plurality of side surface dies;
   filling the cavity with a coating material;
   fixing the display module to a second die using a coupling body disposed on a second surface of the display module, opposite of a first surface of the display module disposed with a plurality of LEDs;
   soaking the display module in the coating material filled in the cavity;
   curing the coating material; and
   separating the cured coating material of the display module from the die plate.

2. The method of claim 1, further comprising:
   cooling the coating material after curing the coating material.

3. The method of claim 1, wherein the forming the cavity comprises moving the plurality of side surface dies to contact the die plate.

4. The method of claim 1, wherein the filling the cavity with the coating material comprises injecting the coating material such that a height of the coating material is greater than a height of the plurality of LEDs disposed on the first surface.

5. The method of claim 1, wherein the separating the cured coating material from the die plate comprises separating the plurality of side surface dies from the die plate.

6. The method of claim 3, wherein
   each of the plurality of side surface dies includes:
   a contact body configured to contact with the die plate;
   an actuator including an axis coupled with the contact body, the actuator configured to move the contact body; and
   a guide body provided on the first die and configured to guide the contact body by slidably-coupling with the contact body,
   wherein the contact body is configured to slidably move along the guide body.

7. The method of claim 1, wherein the soaking the display module in the coating material comprises soaking the display module in a direction of the first surface such that a side surface of the plurality of LEDs is covered with the coating material.

8. The method of claim 1, wherein the coating material includes a heat-curable resin having a light-transmissivity.

9. The method of claim 1, wherein
   the die plate includes a plurality of grooves formed in a shape corresponding to the plurality of LEDs at a position corresponding to the plurality of LEDs, and
   the soaking the display module in the coating material comprises inserting the plurality of LEDs into the plurality of grooves, respectively.

10. The method of claim 9, wherein the coating material includes:
    a first coating material filled in the plurality of grooves and having a first light transmittance; and
    a second coating material stacked on the first coating material, and having a second light transmittance lower than the first light transmittance.

11. A method for forming a display module, the method comprising:
    soaking a first surface of a substrate in a coating material, the first surface disposed with a plurality of LEDs, and the substrate further including a second surface, opposite of the first surface, that is disposed with a plurality of chips connected to the plurality of LEDs and further disposed with a coupling body; and
    curing the coating material while the first surface of the substrate is soaked in the coating material, the cured coating material forming a molding part that covers the first surface and the plurality of LEDs, and has a shape corresponding to a shape of the plurality of LEDs.

12. The method of claim 11, wherein the molding part includes:
    a first portion formed to surround the plurality of LEDs; and
    a second portion positioned on an upper part of the first surface that is not disposed with the plurality of LEDs,
    wherein the first portion and the second portion are formed integrally.

13. The method of claim 12, wherein a thickness of the first portion is smaller than a thickness of the second portion.

14. The method of claim 12, wherein a first light transmittance of the first portion is higher than a second light transmittance of the second portion.

15. The method of claim 11, wherein
    the coating material comprises a heat-curable resin having a light-transmissivity, and the curing the coating material comprises heat curing the coating material.

* * * * *